(12) United States Patent
Vane et al.

(10) Patent No.: US 8,349,125 B2
(45) Date of Patent: Jan. 8, 2013

(54) CLEANING DEVICE FOR TRANSMISSION ELECTRON MICROSCOPES

(75) Inventors: Ronald A. Vane, Redwood City, CA (US); Christopher G. Morgan, Alameda, CA (US); George Safar, La Honda, CA (US); David Varley, Portola Valley, CA (US)

(73) Assignee: XEI Scientific, Inc., Redwood City, CA (US)

(*) Notice: Subject to any disclaimer, the term of this patent is extended or adjusted under 35 U.S.C. 154(b) by 585 days.

(21) Appl. No.: 12/509,225

(22) Filed: Jul. 24, 2009

(65) Prior Publication Data

US 2011/0017247 A1 Jan. 27, 2011

(51) Int. Cl.
*C23F 1/00* (2006.01)
*H01L 21/306* (2006.01)

(52) U.S. Cl. .................................. 156/345.43
(58) Field of Classification Search ............. 156/345.43; 134/1, 1.1; 118/715, 722, 723 R, 723 E; 216/58, 63, 67; 250/306, 307, 309, 310, 250/311, 440.11, 441.11, 442.11; 315/111.21; 313/231.31, 231.41
See application file for complete search history.

(56) References Cited

U.S. PATENT DOCUMENTS

| | | | |
|---|---|---|---|
| 3,418,465 A | 12/1968 | Hahn et al. | |
| 3,769,537 A | 10/1973 | Hofmann | |
| 4,232,229 A | 11/1980 | Tanaka et al. | |
| 4,362,632 A | 12/1982 | Jacob | |
| 4,657,616 A * | 4/1987 | Benzing et al. | 156/345.43 |
| 4,665,315 A | 5/1987 | Bacchetti et al. | |
| 4,810,935 A | 3/1989 | Boswell | |
| 4,833,330 A | 5/1989 | Swann et al. | |
| 4,859,908 A | 8/1989 | Yoshida et al. | |
| 4,977,352 A | 12/1990 | Williamson | |
| 5,007,983 A | 4/1991 | Lerner | |
| 5,241,243 A | 8/1993 | Cirri | |

(Continued)

FOREIGN PATENT DOCUMENTS

JP 05-144716 A 6/1993

(Continued)

OTHER PUBLICATIONS

Lieberman, M.A. and Lichtenberg, A.J., Principles of Plasma Discharges and Materials Processing, 1994, pp. 472-484, John-Wiley & Sons, Inc., New York, Chichester, Brisbane, Toronto, Singapore.

(Continued)

*Primary Examiner* — Maureen Gramaglia
(74) *Attorney, Agent, or Firm* — Mark D. Perdue

(57) ABSTRACT

An apparatus for cleaning the specimen and interior specimen chamber of Transmission Electron Microscopes, and similar electron- or charged-particle-beam instruments consisting of a plasma cleaning device mounted on a hollow rod that replaces the stage through the air lock of the instrument by being the same shape and size as the stage support rod. The plasma cleaning device is a small hollow cathode that is excited by RF power. Air or other oxygen containing mixtures is admitted to the plasma through the hollow rod at a pressure below 1 Torr. The plasma creates oxygen radicals from the oxygen containing gas. The oxygen radicals oxidize the hydrocarbons contamination and convert them to easily pumped gases. The apparatus can be attached to the electron microscope whenever cleaning is needed, and then is easily removed to return the instrument to its analytical function.

12 Claims, 6 Drawing Sheets

U.S. PATENT DOCUMENTS

| | | | |
|---|---|---|---|
| 5,302,343 | A | 4/1994 | Jacob |
| 5,312,519 | A | 5/1994 | Sakai et al. |
| 5,326,971 | A | 7/1994 | Theodore et al. |
| 5,401,974 | A | 3/1995 | Oae et al. |
| 5,466,942 | A | 11/1995 | Sakai et al. |
| 5,508,528 | A | 4/1996 | Mulkens et al. |
| 5,510,624 | A | 4/1996 | Zaluzec |
| 5,539,211 | A | 7/1996 | Ohtoshi et al. |
| 5,549,874 | A | 8/1996 | Kamiya et al. |
| 5,633,502 | A | 5/1997 | Fischione |
| 5,821,544 | A | 10/1998 | Augustus et al. |
| 5,976,992 | A | 11/1999 | Ui et al. |
| 6,098,637 | A | 8/2000 | Parke |
| 6,105,589 | A | 8/2000 | Vane |
| 6,106,788 | A | 8/2000 | Rau et al. |
| 6,112,696 | A | 9/2000 | Gorin |
| 6,143,129 | A | 11/2000 | Savas et al. |
| 6,143,477 | A | 11/2000 | Rhieu |
| 6,242,737 | B1 | 6/2001 | Ohnishi et al. |
| 6,281,510 | B1 | 8/2001 | Yoshitake et al. |
| 6,452,315 | B1 | 9/2002 | Vane |
| 6,503,447 | B1 | 1/2003 | Mondjian et al. |
| 6,517,776 | B1 | 2/2003 | Rodgers et al. |
| 6,610,257 | B2 | 8/2003 | Vane |
| 6,646,278 | B1 | 11/2003 | Schwarz et al. |
| 6,649,545 | B2 | 11/2003 | Agarwal |
| 6,667,475 | B1 | 12/2003 | Parran et al. |
| 6,724,460 | B2 | 4/2004 | Van Schaik et al. |
| 7,005,638 | B2 | 2/2006 | Spill |
| 7,190,512 | B2 | 3/2007 | Sakai et al. |
| 7,737,416 | B2 | 6/2010 | Gunji et al. |
| 7,767,979 | B2 | 8/2010 | Dona |
| 8,011,259 | B2 | 9/2011 | Dona |
| 2003/0059549 | A1 | 3/2003 | Morrow et al. |
| 2004/0108067 | A1 | 6/2004 | Fischione et al. |
| 2005/0104015 | A1 | 5/2005 | Wedowski et al. |
| 2005/0242379 | A1 | 11/2005 | Sakai et al. |
| 2006/0192158 | A1 | 8/2006 | Wedowski et al. |
| 2010/0230592 | A1 | 9/2010 | Gunji et al. |
| 2011/0017247 | A1 | 1/2011 | Vane et al. |
| 2011/0260056 | A1 | 10/2011 | Huang et al. |

FOREIGN PATENT DOCUMENTS

| | | |
|---|---|---|
| JP | 2000-340165 A | 12/2000 |
| JP | 2001-144000 A | 5/2001 |
| JP | 2007324128 | 12/2007 |

OTHER PUBLICATIONS

Davis, H., "Plasma Etching Cleans Hydrocarbon Surface Contamination,", Los Alamos National Laboratory, Nov. 25, 1995, http://www-emtd.lanl.gov/td/prevention/plasmacleaning.html.

Argonne National Laboratory Plasma Cleaning Technology, "Technique for Simultaneous Specimen & Stage Cleaning for Analytical Electron Microscopy," Apr. 1996, http://www.amc.anl.gov/docs/anl/techtrans/plasmacleaning.html.

Roberts et al., "Applications of Reactive Gas Plasma Cleaning Technology in Minimizing Contamination of Specimens During Transmission and Analytical Electron Microscopy," Materials Research Society Symposium Proceedings, 1997, pp. 127-136, v. 480, Materials Research Society.

Vane, R. and Strossman, G., "Evactron Cleaning of SEM Specimens Using an In-Situ RF Plasma on the SEM Chamber," Microscopy and Microanalysis 2001, http://evactron.com/strossman.html.

Vladar et al., Active Monitoring and Control of Electron Beam Induced Contamination, SPIE, 2001, p. 835, v. 4344.

Vane, R. and Carlino, V., "Environmental Contamination Sources and Control in High Resolution Scanning Electron Microscopy," Microscopy and Microanalysis 2005, http://evactron.com/sourcontrol.pdf.

Vane, R., "Immobilization and Removal of Hydrocarbon Contamination Using the Evactron De-Contaminator," Microscopy and Microanalysis 2006, http://evactron.com/immobilization2006.pdf.

Morgan et al., "Quantification of Contaminant Removal by Evactron Cleaning Using Quartz Crystal Thickness Monitors," Microscopy Today, Sep. 2007, p. 22-25.

Fridman, A., Plasma Chemistry, 2008, pp. 247-255; 347-349; 539-541, Cambridge Univ. Press, New York.

Aist, A Process for Cleaning a Transmission Electron Microscope without Disassembling, Jul. 7, 2008, http://www.aist.go.jp/aist_e/latest_research/2008/20080804/20080804.html.

Horiuchi et al., "Contamination Free Transmission Electron Microscopy for High Resolution Carbon Elemental Mapping of Polymers," ACS Nano, 2009, pp. 1297-1304, v. 3 No. 5, American Chemical Society.

Brochure, XEI Scientific, Inc., Evactron TEM Wand, Mar. 2010.

Brochure, XEI Scientific, Inc., Evactron De-Contaminator Catalog, Mar. 2010.

Grant et al., "Surface Science Aspects of Contamination in TEM Sample Preparation," Materials Research Society Symposium Proceedings, pp. 49-71, v. 480, Materials Research Society.

Vladar et al., Contamination Specification for Dimensional Metrology SEMs, SPIE, pp. 6922171-6922175, v. 6922.

Roberts, Zaluzec, Walck, Grant, Applications of Reactive Gas Plasma Cleaning Technology in Minimizing Contamination of Specimens During Transmission and Analytical Electron Microscopy, vol. 480—1997 MRS Spring Meeting—Symposium Z—Specimen Preparation for Transmission Electron Microscopy . . . IV, Abstract.

* cited by examiner

CLEANING DEVICE FOR TRANSMISSION ELECTRON MICROSCOPES

TECHNICAL FIELD OF INVENTION

The invention relates to cleaning electron microscopes and other charged-beam instruments with a confined space near the specimen analytical area. In particular, it is a method for the production of plasma-activated, gentle chemical etching of hydrocarbon-containing molecules by oxygen radicals in both the sample (or specimen) analysis and sample exchange chambers of the analytical instrument. This method is accomplished by placing the means of generating said oxygen radicals at the distal end of a hollow rod dimensioned to replace the sample rod used to insert samples into the analytical instrument chambers. This method includes sealing and indexing members used to position the sample rod into the analytical instrument chambers and replicate sample rod functions. It is emphasized that said etching process occurs entirely via chemical reactions and not physical mechanisms such as sputtering.

BACKGROUND OF THE INVENTION

Electron microscopy is used to detect, measure, and analyze features and constituents present in very small areas of material specimens and samples (the terms specimen and sample are used interchangeably). These specimens and samples are placed into the analytical instrument and interact with the electron beam of the electron microscope. These specimens introduced into the analytical instrument have contaminants and other foreign species adsorbed, attached or present on the sample. These contaminant species, upon interaction with the incident electron beam, distort the analytical measurements and detract from the accuracy and quality of the analytical measurements. Most often, the electron beam reacts with the impurity species, forming deposits on the surface of the sample. These deposits in turn interfere with secondary electron emission, X-ray emission or electron image formation in the analytical instrument. Whenever these impurities are present in the analysis chamber, these deposits are produced. The contaminant deposits when present show a demonstrated reduction in contrast and resolution in both transmission electron microscopes (TEM) and scanning electron microscopes (SEM).

All modern transmission electron microscopes and some scanning electron microscopes utilize sample introduction and manipulation stages that extend into and between the electron beam lens pole pieces. This is known as "in the lens" imaging. A sample mounting platform is placed at the end of a long, hollow cylindrical "stage" rod. The sample stage extends through the instrument airlock and into the microscope analysis chamber. The length of this rod enables both accurate positioning of the sample at the object plane of the electron microscope and accurate adjustment of the sample, once placed at the correct location. The electron beam is precisely focused on an aperture in the center of the analysis chamber. The sample is located precisely below this aperture. After passing through the aperture and sample, the electrons are collected for subsequent analysis. Adjustment of the sample orientation with respect to the electron beam is achieved with a goniometer connected to the stage mechanism. The goniometer is an angular adjustment mechanism that allows precise positioning of the sample with respect to the electron beam.

Samples and specimens for transmission electron microscopy must undergo preparation before they can be analyzed in the instrument. The samples are thinned using various preparation techniques such that the electron beam can pass through the sample, and the TEM imaging optics can properly form a virtual image at the microscope image plane. The electron beam is very tightly focused within this region of the instrument. Electron beam properties at the instrument object plane place great constraints on the sample size and thickness.

The electron microscope sample introduction and manipulator stage utilizes a vacuum-airlock mechanism to ensure that the samples are introduced into the analysis chamber with no disruption to the vacuum in the electron microscope. The vacuum airlock mechanism is implemented with multiple O-ring seals positioned at intervals along the hollow stage support rod. The system also uses a location pin or fixture that has a precise relationship to these O-ring seals. Typical operation of the airlock is as follows: Using the stage support rod, the stage is inserted into the airlock until the locating pin reaches a position stop. When the sample stage reaches this stop, it is rotated through a large angle, typically 90 degrees or greater. Rotation of the stage causes the location pin to activate the airlock pump-down cycle. Once an appropriate pressure level is reached in the airlock, an isolation valve between the airlock and the analysis chamber is opened and the sample stage passes into the microscope analysis chamber. This system ensures that sample transfer occurs at the correct time in the evacuation sequence and that the sample is positioned reliably and reproducibly in the microscope analysis chamber.

Electron microscopy systems, especially TEM systems, are highly susceptible to chemical contaminants. These contaminants can be introduced into the microscope system by four mechanisms: specimen contamination, stage contamination, airlock contamination, and leaks. These contaminants, once introduced onto system surfaces, including the electron optical system, are only very slowly removed by the inefficient instrument vacuum pumping system.

Specimens or samples may carry these contaminants into the chamber. These may be part of the specimen, residues from sample preparation techniques or be caused by improper sample handling or storage techniques. For organic specimens, the contamination may be induced by the exposure of the specimen and degradation of the surface by the high energy electron beam. In addition, clean surfaces will accumulate a surface film of hydrocarbon scum if left exposed to ordinary room air for any length of time. The sources of these hydrocarbons are most any living thing, organic object, or other source of hydrocarbon vapors in the vicinity. While the part of the films created in these processes dissipate under vacuum conditions, a small amount generally remains on surfaces and is sufficient to cause problems when the specimen is subsequently examined in the analytical instrument.

Specimens or samples may carry these contaminants into the chamber. These may be part of the specimen, residues from sample preparation techniques or be caused by improper sample handling or storage techniques. For organic specimens, the contamination may be induced by the exposure of the specimen and degradation of the surface by the high energy electron beam. In addition, clean surfaces will accumulate a surface film of hydrocarbon scum if left exposed to ordinary room air for any length of time. The sources of these hydrocarbons are most any living thing, organic object, or other source of hydrocarbon vapors in the vicinity (e.g., solvents and other aromatic compounds). While some of the compounds created in these processes dissipate from surfaces under vacuum and related conditions, other compounds and conditions generally insure residual amounts will remain on surfaces and even minute amounts of this contamination are sufficient to cause problems when the specimen is subsequently examined in the analytical instrument.

Plasma cleaning has been shown to be useful for removing hydrocarbon contamination. A device for cleaning electron microscope stages and specimens is described in U.S. Pat. No. 5,510,624 (Zaluzec) for analytical electron microscopes including TEM. That apparatus uses a plasma generating chamber and an airlock to allow the specimen and stages to be placed into the plasma chamber for cleaning. It may be connected with the analytical chamber of the analytical electron microscope. Several commercial desktop plasma cleaners licensing this patent are sold for cleaning stages and specimen together before inserting into the TEM.

Vane disclosed in U.S. Pat. Nos. 6,105,589, 6,452,315 and 6,610,257 the technology used by XEI Scientific, Inc. in the Evactron® De-Contaminator systems that use an air plasma to produce oxygen radicals for downstream cleaning of electron microscopes and other vacuum systems that have been sold since 1999. These patents describe an oxidative cleaning system and apparatus using low powered RF plasma to produce oxygen radicals, an active neutral species, from air to oxidize and remove these hydrocarbons. The device is mounted on the outside of the electron microscope and the excited gas moves into the specimen chamber by convective flow created by the rough vacuum pump. This device works well on SEMs, but on TEMs has achieved only limited success because of the need to add an additional vacuum pump to get enough flow through the chamber. A recent publication describes this technique using the Evactron® De-Contaminator for SEM with an additional pump (Shin Horiuchi et al., *Contamination-Free Transmission Electron Microscopy for High Resolution Carbon Elemental Mapping of Polymers*, ACS Nano, 1297 (2009)). As stated by Horiuchi, "[H]owever, the beam-induced specimen contamination in the TEM cannot be reduced by the simple operation of the plasma generator as for SEMs. The reason is assumed that the specimen chamber and vacuum path of the TEM are considerably narrow, where sufficient oxygen radicals cannot be supplied into the chamber simply by the roughing pump of the microscope."

SUMMARY OF THE INVENTION

It is accordingly an object of this invention to reduce the need to add an auxiliary vacuum pump to the transmission electron microscope (or other charged-particle-beam instrument) to increase cleaning speed and to remove hydrocarbons with a plasma device in a reasonable time. It is another object of this invention to bring the production of the excited cleaning gas to a location inside the specimen chamber of the electron microscope to clean the "in the lens" imaging regions. It is another object of this invention to bring the plasma region into the TEM so that the production of radicals is close to the regions to be cleaned. It is another object of the present invention to be able to clean both the specimen exchange chamber and specimen chamber by producing oxygen radicals or other excited species in the hollow cathode generated plasma. It is another object of this invention to clean all of the vacuum chamber by flowing the excited gas out of the plasma region to react with contaminates throughout the chamber. It is another object of this invention to use an oxygen-containing gas such as pure oxygen, air, nitrogen/oxygen mixtures, water vapor, oxygen/argon mixtures and gas mixtures of these to make the excited gas in a plasma. Accordingly, this invention comprises a small hollow cathode plasma electrode mounted on the distal end of a stage rod so it may be inserted into the electron microscope through the specimen exchange chamber, and the electrode is supplied with cleaning gas and plasma power through the rod so that cleaning is done using a hollow cathode generated plasma that excites a cleaning gas within either the specimen chamber or the exchange chamber. The excited gas then flows through the chamber towards the vacuum pump, and the excited gas reacts with hydrocarbons along the way so that they are volatilized to be removed by the pumps. The process is limited by the number of oxygen radicals or other reactive species created in the excited gas mixture. Small TEM chambers can be cleaned with fewer radicals than larger SEM chambers. This allows a smaller source of oxygen radicals to be used in this invention.

In U.S. Pat. No. 4,657,616, In-Situ CVD Chamber Cleaner, Benzing describes a method for plasma cleaning of film deposition chambers that are used for repetitive deposition of relatively thick (10,000's of Angstroms) inorganic films such as silicon, silicon dioxide, and silicon nitride. In Benzing's method a contaminated, open-ended tube is vented to open air through its open end, then the cleaning apparatus is inserted and sealed against the open end of the tube and the tube is evacuated. A plasma is ignited at pressures of a fraction to several Torr along the length of the electrodes in close proximity to the contaminating film, which then removes the film via chemical and physical means which volatilize the film components. At the end of the cleaning process the CVD chamber is again vented to atmospheric pressure and the cleaning apparatus is removed. It is noteworthy that the Benzing apparati are limited to the single structural form of a cylindrical shape as shown in his high-aspect (Benzing FIGS. 4-10) and medium-aspect (Benzing FIGS. 11,12) electrode designs; this structural limitation is necessitated by industry standards for CVD chambers. (The reduced aspect designs of FIGS. 11 and 12 are simply shorter versions of the designs of FIGS. 4-10 and serve only to limit the cylindrical plasma to a shorter length.) Moreover the structural specifics described by Benzing indicate that the method is limited to the cleaning of cylinder interior walls.

DETAILED DESCRIPTION OF THE INVENTION

Figure 1:
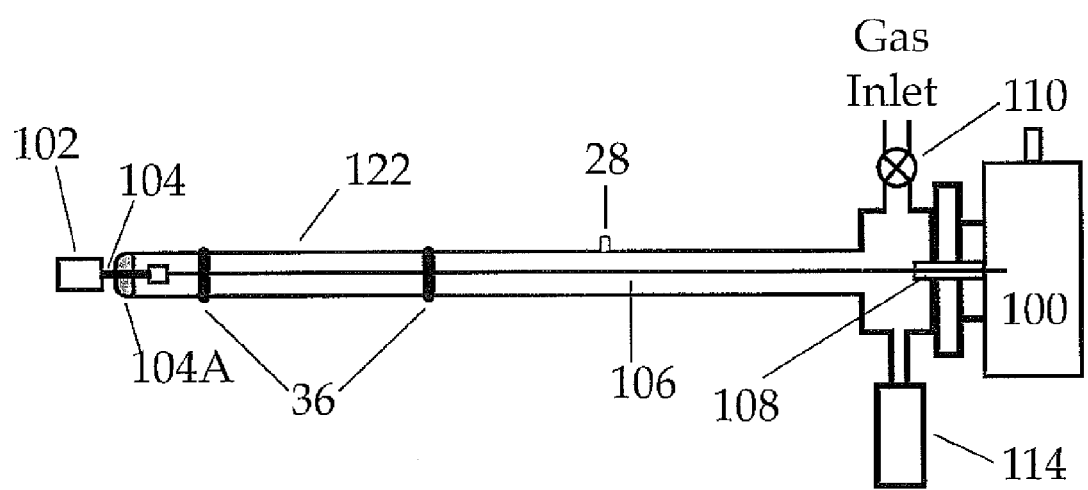
FIG. 1 is a schematic showing the cleaning device that can be inserted into a TEM in place of a TEM stage.

Referring now to the Figures, the preferred embodiment of the present invention is shown in FIG. 1. It consists of a small hollow cathode 102 mounted onto the distal end of a hollow rod 122 that has the exterior shape of a stage support rod so that it may pass into a Transmission Electron Microscope, or Scanning Transmission Microscope (STEM) or Scanning Electron Microscope that has in-the-lens imaging and small volume vacuum chambers. To enable passage into the instrument through the air lock, the locating pin 28 O-rings 36 and other shapes of the stage support rod are duplicated in exactly the same geometry. The small hollow cathode electrode 102 is mounted on a rigid conductive support 104 that is connected to the electrical conductor 106 that connects to the plasma power source outside the vacuum via the vacuum electrical feedthrough 108 and the electrical power connection utility 100. In the preferred embodiment, this electrical conductor 106 is a shielded coaxial cable inside the hollow rod 102. This coaxial cable is connected to an impedance matching network contained within the electrical power connection utility 100. At the distal end of the rod, an insulating support 104A centers the rigid support 104 and the hollow cathode 102.

Figure 2:
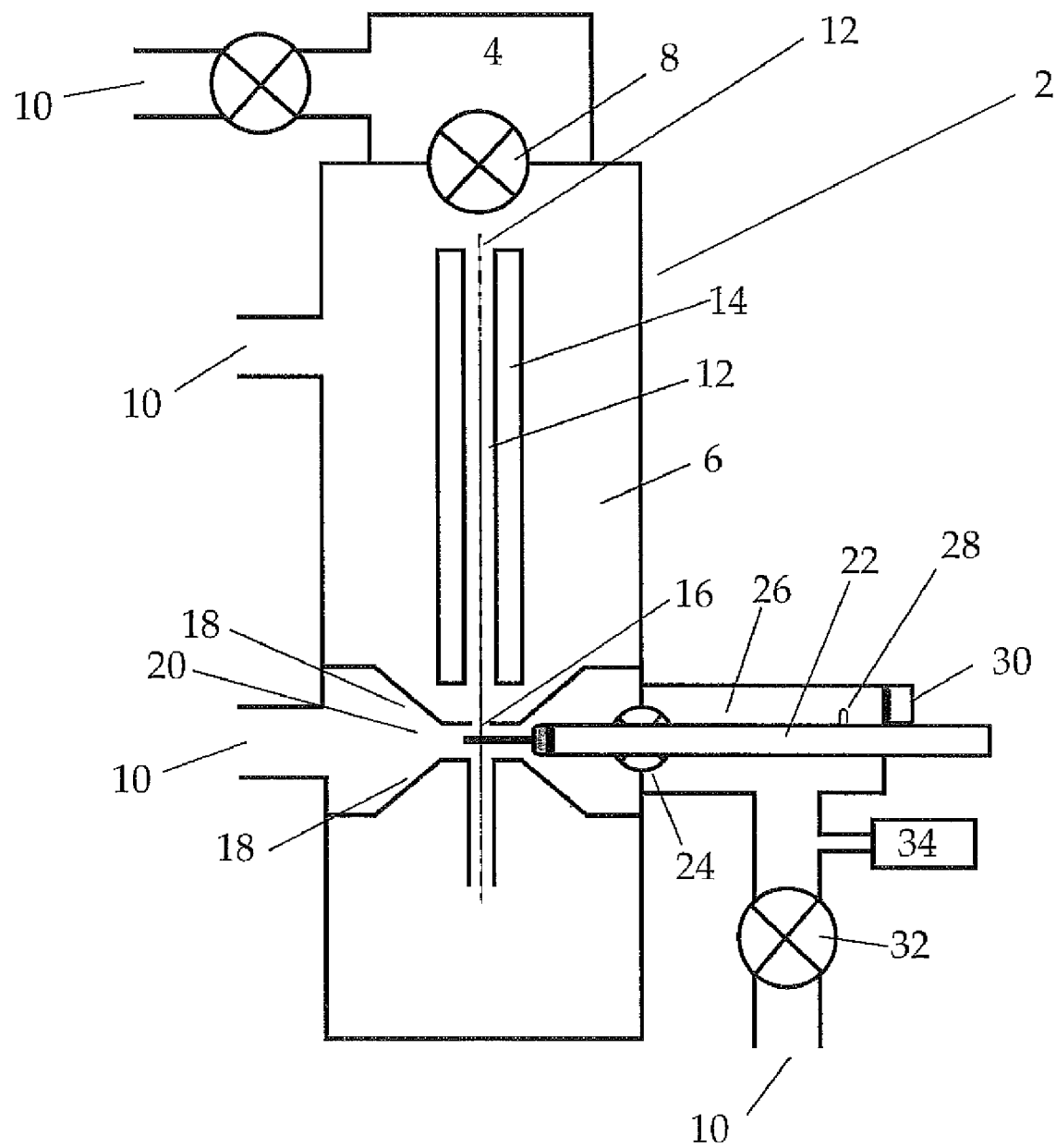
FIG. 2 is a schematic showing the general placement of the cleaning device as it relates to the TEM instrument.

Referring to FIG. 2, this figure illustrates the general arrangement of the cleaning device in the context of a charged-particle beam instrument 2 (TEM) of the type with or in which the present invention is used. Such an instrument 2 may be a Transmission Electron Microscope (TEM), a Scanning Transmission Microscope (STEM), a Scanning Electron Microscope (SEM), or any other charged-particle beam instrument that has or uses in-the-lens imaging and a small-volume vacuum chamber. Instrument 2 uses a charged-particle device in the form of an electron gun 4, which is mounted on a relatively small volume vacuum chamber 6 through a gun valve 8. Electron gun 4 operates at a higher (lower pressure) vacuum than vacuum chamber 6, and valve 8 is required to permit the pressure differential. Electron gun 4 and vacuum chamber 6 are evacuated by a series of vacuum pumps 10. Electron gun 4 emits a beam of electrons (charged particles) 12, which passes through an objective lens 14 and an aperture 16 formed in an upper of a pair of conical poles 18. Between the conical poles 18, a specimen or sample imaging chamber 20 is defined in which the specimen is arranged and manipulated to be impinged upon by the electron beam for analysis.

The sample or specimen is inserted into, and manipulated within, this chamber 20 by a stage support rod 22, which passes into vacuum chamber 6 and specimen chamber 20 through apertures that are sealed and valved 24 against gas flow into and out of vacuum chamber 6, so that a vacuum can be maintained. Before passing into vacuum chamber 6, stage support rod 22 passes through a sealed exchange chamber 26, which functions as an "air lock" to allow samples or specimens to be attached to and removed from stage support rod 22, while maintaining a vacuum in chamber 6. Rod 22 is also provided with an indexing member or locating pin 28, which cooperates with a position sensor 30 to assist in the rotational and axial positioning of rod 22 within chamber 6 and specimen chamber or region 20. Exchange chamber 26 is evacuated with a vacuum pump acting through a valve 32 and has a pressure gauge 34.

The construction described is almost universal with respect to conventional transmission electron microscopes, especially as concerns stage support rod 22. Such rods are conventional in such instruments, and, as noted, provided with various sealing 24 and index mechanisms, such as a position sensor and associated instrumentation 28, 30, to insure that vacuum integrity is maintained and to permit careful and precise insertion and manipulation of the sample or specimen within the specimen imaging chamber or region 20 of vacuum chamber 6.

Such sealing and indexing mechanisms vary with the manufacturer and type of instrument. As will be described in greater detail below, an aspect of the invention is to provide oxidative cleaning of the specimen region or area 20 to remove hydrocarbon contaminants from the various surfaces therein. This is in part accomplished by replacing the stage support rod with a similar, if not identically, dimensioned rod that maintains the seal and indexing mechanisms of the stage support rod supplied with the instrument. According to the invention, this replacement stage support rod, referred to as a "hollow rod," conveys an electrode (cathode) into the vacuum chamber 6 of the instrument 2, and supplies gas and electric current to the cathode to conduct oxidative cleaning in the specimen imaging region 20.

Figure 3:
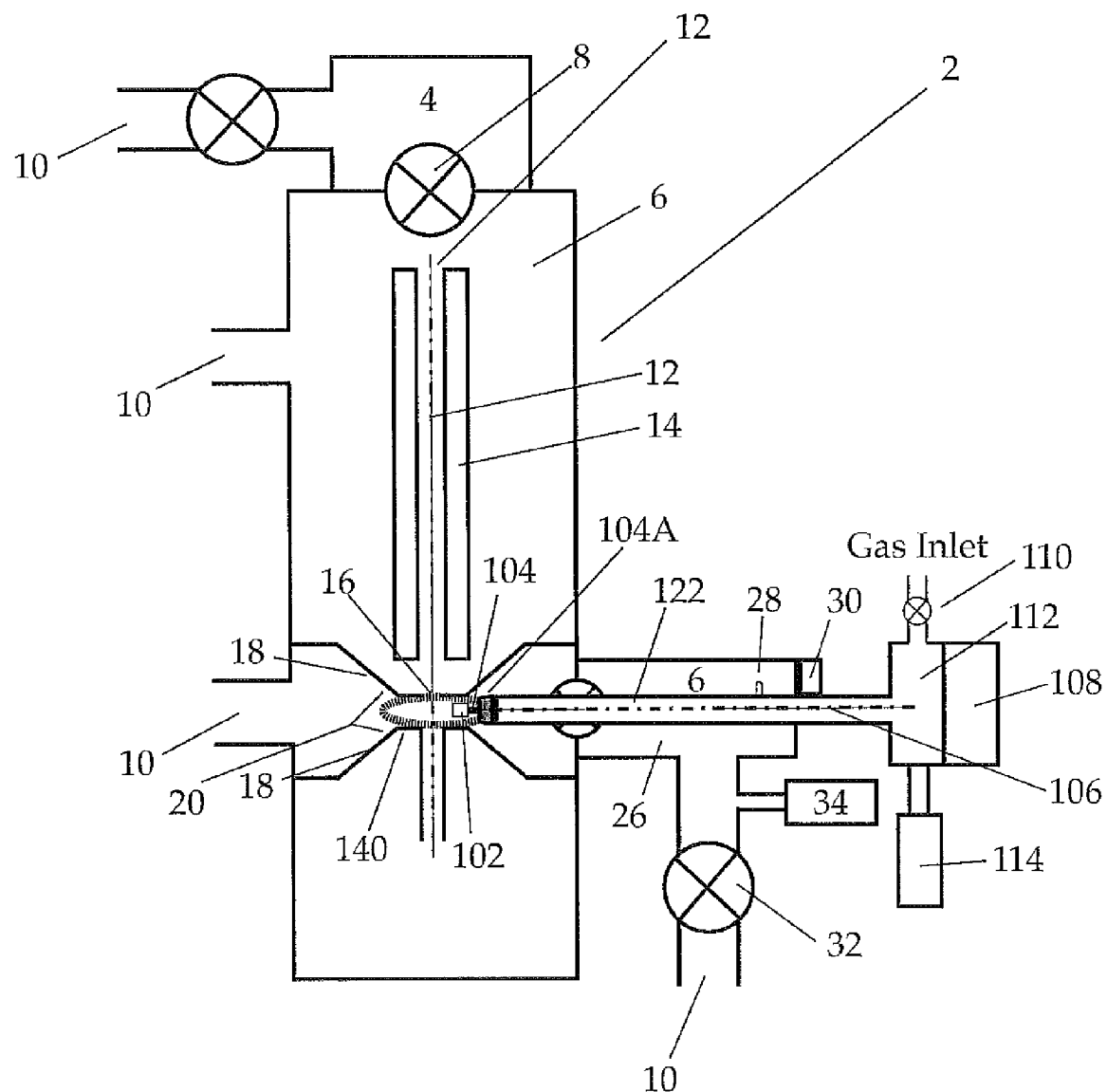
FIG. 3 is a schematic of the cleaning device inserted into the TEM specimen chamber.
Figure 4:
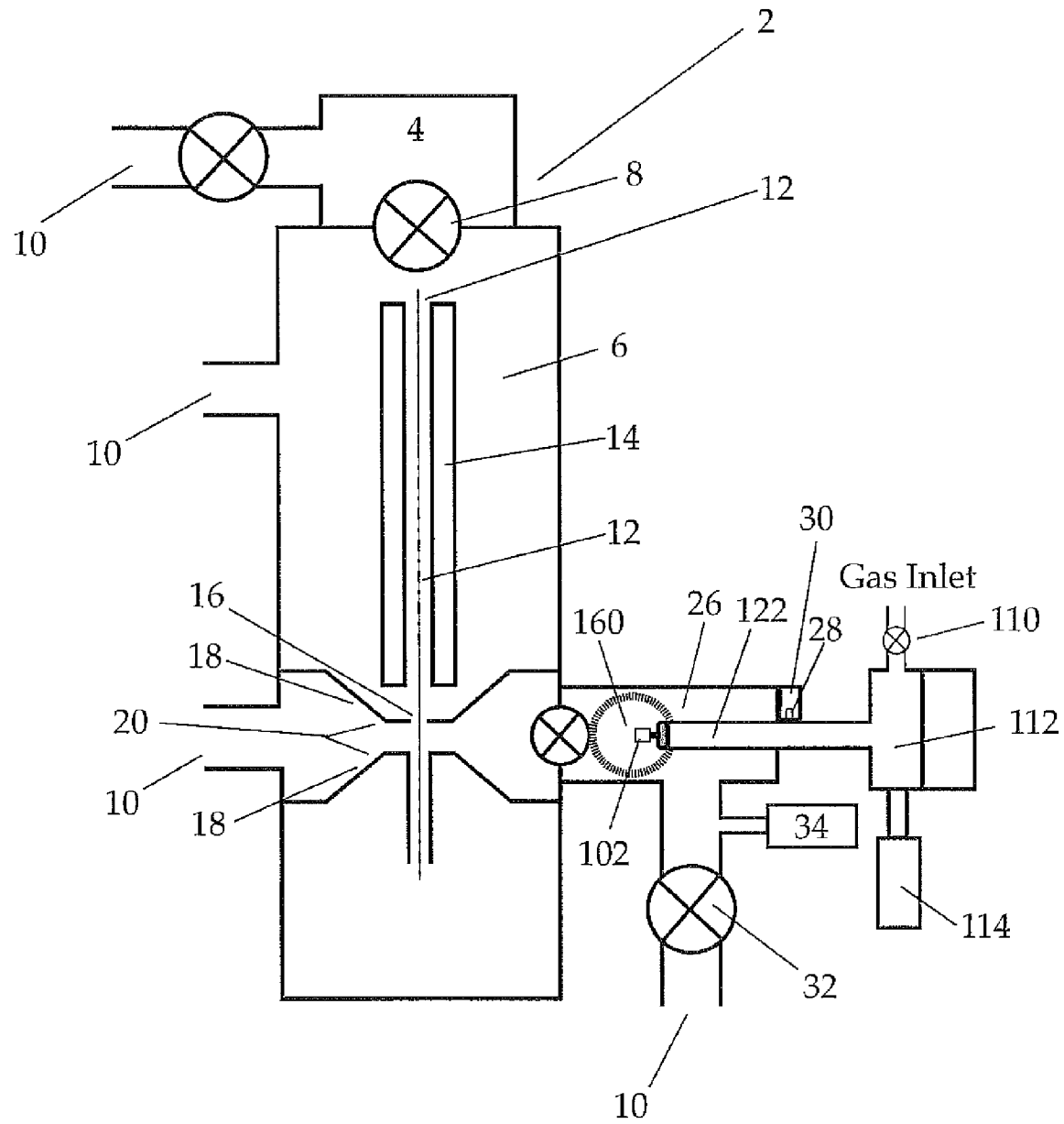
FIG. 4 is a schematic of the cleaning device inserted into the TEM specimen exchange chamber.

The preferred and illustrative embodiments of the present invention are shown in FIGS. 3 and 4. It comprises a small hollow cathode 102 (positively charged electrode) (described in detail in FIG. 5) mounted onto the distal end of a generally tubular hollow rod 122 that has the exterior shape and dimension of a stage support rod 22 so it may pass into a vacuum 6 and specimen chambers 20 of a charged-particle beam instrument 2 as described above. To enable passage into the vacuum chamber 6 of instrument 2 through the exchange chamber or air lock 26, the locating pin 28, O-rings, and other shapes of the stage support rod 122 preferably are duplicated in exactly the same geometry and dimension as the original stage rod 22. The small hollow cathode electrode 102 is mounted on a rigid conductive support 104 that is connected to an electrical conductor 106 that connects to a plasma power source outside of the vacuum chamber 6 via a coaxial electrical cable feedthrough. In a preferred embodiment, this electrical conductor 106 is a shielded coaxial cable inside the hollow rod 122, and is electrically connected to an electrical impedance matching network.

A cleaning gas is supplied to the interior of the hollow rod 122 to hollow cathode 102 through holes in the insulating support 104A. The flow of cleaning gas into the hollow rod 122 is controlled by a control valve 110 on the rod support chamber 112 outside the vacuum 6 and exchange chambers 26. This control valve 110 may be controlled either manually by a needle valve, or electrically by a variable solenoid valve, to vary the flow of gas through hollow rod 122. A vacuum gauge 114 is used to monitor the pressure and flow through the hollow rod 122.

FIG. 3 shows an embodiment of the instrument 2 of FIG. 2, with hollow rod 122 extended into the specimen imaging chamber 20. In this position, when under vacuum, the assembly may clean the specimen imaging chamber 20 of the instrument.

When electrical power is supplied to the hollow cathode electrode 102 while cleaning gas flows through hollow rod 122, a plasma is created in the plasma region 140. As previously described, the small hollow cathode electrode 102 is positioned by hollow rod 122 in or proximal to the specimen imaging chamber 20. Cleaning gas is supplied to the interior of the hollow cathode 102 from the hollow rod 122 through holes in the insulating support 104A. The flow of cleaning gas into the hollow rod 122 is controlled by a control valve 110 on the rod support chamber 112 outside the vacuum. The cleaning gas moves from the support chamber 112 through the interior of the rod 122, through the insulating support 104A into the hollow cathode 102 and into the specimen imaging chamber 20.

In the specimen imaging chamber 20, the cleaning gas is converted into the excited cleaning gas by powered or energized hollow cathode 102 to form a plasma region 140. The plasma region 140 may extend "in the lens" or the excited cleaning gas will clean the pole pieces 18 and the aperture 16. A pressure gauge 114 is used to monitor the pressure and flow through the rod. In a preferred embodiment, this pressure gauge 114 is a pirani-type gauge. The pressure reading from the pressure gauge 114 will read higher than the pressure in the plasma region 140 because of the flow differential caused by the gas flowing out the distal end of rod 122 into the lower pressure found there. The position sensor 30 uses the locating pin 28 on the hollow rod 122 to sense the axial location of the distal end of rod 122 and its rotational orientation so that the air lock valve 24 is opened and closed as appropriate. In this illustration, the locating pin 28 has gone inside the exchange chamber 26 and the inside air lock valve 24 is open with the rod passing through it.

Figure 5:
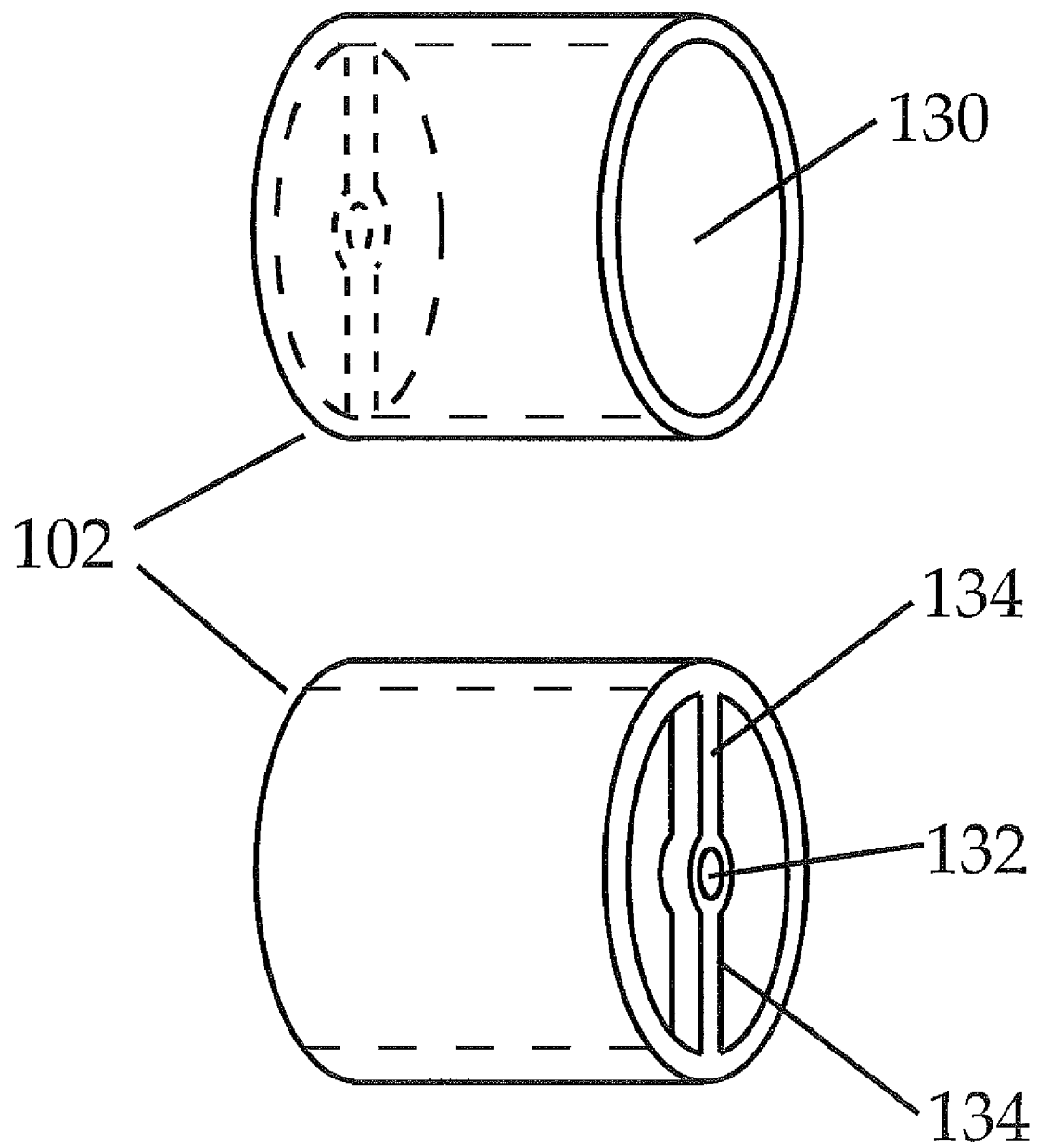
FIG. 5 is an enlarged view of the small hollow cathode electrode.

FIG. 4 shows another embodiment of the charged-particle-beam instrument 2 with the hollow rod 122 and hollow cathode 102 according to the invention retracted or located inside the specimen exchange chamber/air lock 26. In this position, when under vacuum, the invention may clean the air lock 26 portion of the instrument. Again, cleaning gas passes through hollow rod 122 and into the specimen exchange chamber 26. When power is supplied to the hollow cathode electrode 102, a plasma is created in the plasma region 160. Plasma region 160 is inside the specimen exchange chamber/air lock 26 and cleans only that region. In the position shown, the locating pin 28 and the position sensor 30 are in contact and the exchange chamber 26 being evacuated by the vacuum pump 10 when vacuum valve 32 is opened. To use the plasma cleaning method of the "Evactron" plasma cleaning device (U.S. Pat. No. 6,105,589 to Vane) without having to add an extra pump to the instrument for rough pumping, a small hollow cathode 102 was developed, as shown in FIG. 5. The hollow cathode electrode 102 is a relatively short small-diameter hollow cylinder 130 formed of electrically conductive metal, according to the illustrative embodiment, aluminum. At one end, a disk with an aperture 132 is supported by a pair of radially extending arms 134 in approximately the center of the open end of the hollow cylinder 130. Aperture 132 receives the bare-wire end of electrical conductor 106. Aperture 132 may be threaded or crimped onto the end of electrical conductor 106.

Figure 6:
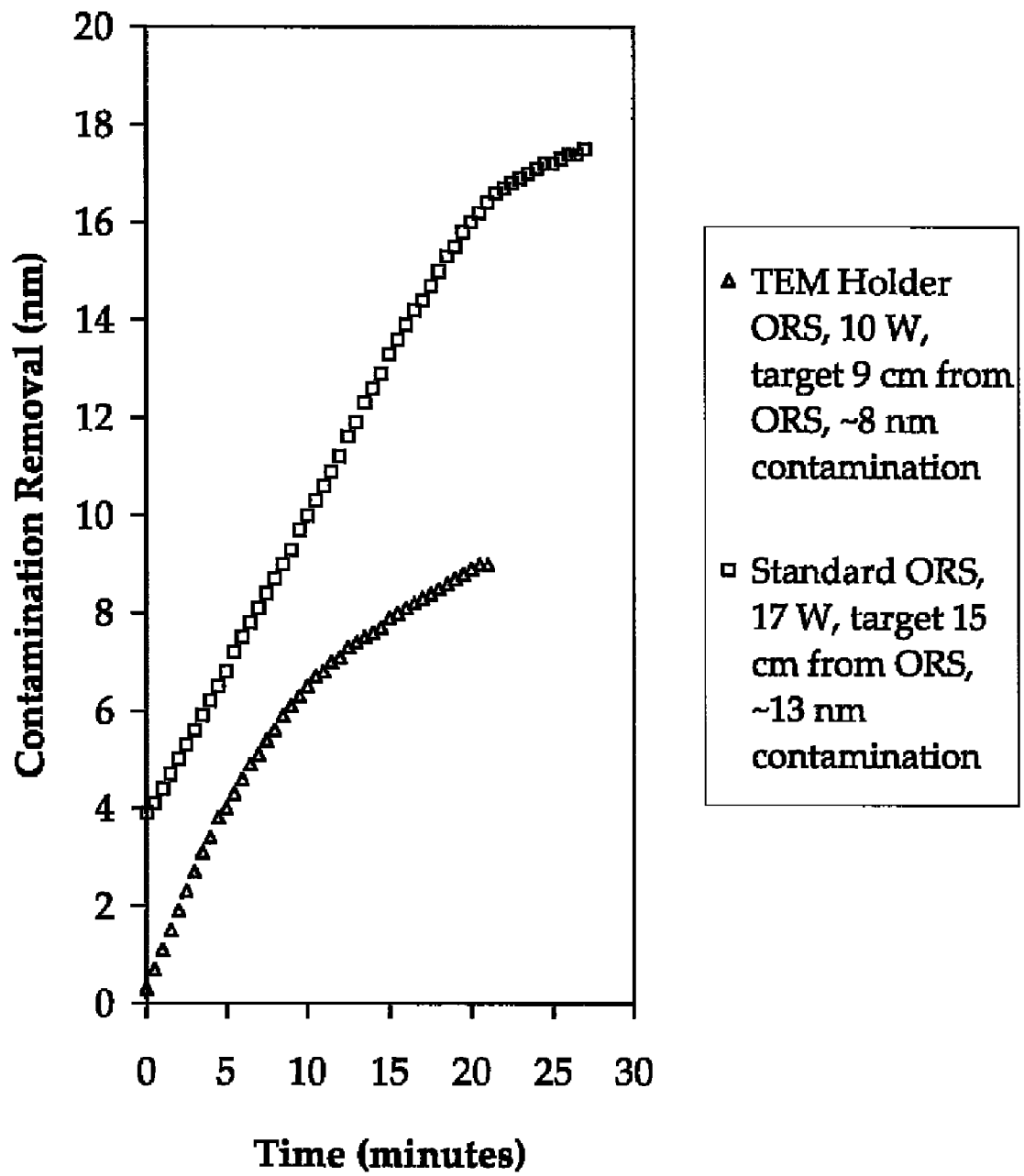
FIG. 6 is a chart of cleaning rates of the regular "Evactron" hollow cathode electrode and the small electrode of this invention.

The small electrode was needed so that it could be inserted into the specimen exchange chamber/airlock 26 and imaging chamber 20. To accomplish this, the hollow cathode electrode 102 was made a smaller diameter and length so that it could replace the stage at the end of a hollow rod 122. As noted, the outer diameter of hollow cathode electrode 102 should be less than or equal to that of hollow rod 122 to permit passage of hollow rod 122 through apertures and seals provided for stage support rod 22. The plasma cleaning gas could then be produced in-situ by the plasma inside of hollow cathode 102 within the specimen chamber 20 of the instrument 2. It was determined that plasma within a smaller hollow cathode produces less cleaning gas than the larger "Evactron" hollow cathode electrode described in U.S. Pat. No. 6,610,257 (Vane), as shown by the data in FIG. 6. Although a reduced number of radicals are produced, the closer cleaning position and of the electrode in this invention, and the smaller chamber volume of the TEM makes up for the lower production rate of oxygen radicals caused by the smaller electrode size. FIG. 6 demonstrates the reduced production of the radicals from the smaller sized hollow cathode electrode 102 of the present invention compared to that of the standard Evactron® device.

According to the preferred illustrative embodiment of the invention, radio frequency (RF) power at 13.56 MHz or other frequencies is fed to the hollow cathode electrode 102. If the vacuum pressure is correct, plasma will be created inside the hollow cathode electrode 102 and the plasma will extend into the region surrounding the hollow cathode electrode 102. The excited space within the plasma sheath is the plasma region 140 or 160. When air or an oxygen-containing gas mixture is supplied to the plasma region, oxygen radicals and/or other active species can be produced that can oxidize and remove hydrocarbons. In the preferred and illustrative embodiment of the present invention, this reactive cleaning gas is air. The cleaning gas may be any mixture of oxygen with nitrogen, water vapor or argon. These gas mixtures form oxygen radicals in the plasma that remove hydrocarbons by oxidation. Another embodiment uses hydrogen mixtures or ammonia $NH_3$ gas mixtures as the cleaning gas to form active neutral species in the plasma to destroy contaminants by reduction. Valve 110 controls the cleaning gas flow into the plasma and into the chamber. In the preferred and illustrative embodiment of the present invention, the cleaning gas is fed directly into the hollow cathode electrode 102 through the hollow rod 122 and insulated support 104A, and oxygen radicals or other active neutral species from the plasma regions 140 or 160 flow into the chambers 20 and 26, respectively. Pressure gauge 114 is used to monitor the pressure during cleaning. Because the cleaning gas is flowing into the plasma region, an excited gas, including radicals and other active neutral species, will flow out of the plasma region into other interior spaces of the vacuum chamber 6 of instrument 2. This excited gas flows by the pumping differential and carries radicals and other excited species that chemically react with hydrocarbons to remove contamination molecules as volatile species.

Another embodiment of the invention uses high voltage DC or high-frequency AC to create the plasma in the small hollow cathode electrode 102. The electrical conductor 106 in this embodiment does not need to be a coaxial cable but may be an insulated wire. In this embodiment, an RF impedance matching network is not required. The invention has been described with reference to preferred, but exemplary or illustrative embodiments thereof It is thus not limited, but is susceptible to variation and modification without departing from the scope of the invention.

We claim:
1. A plasma cleaning apparatus for use with a charged-particle-beam instrument of the type having a vacuum chamber containing a specimen imaging area and a stage support rod for insertion and manipulation of specimens in the specimen imaging area with an exchange chamber in fluid communication between the vacuum chamber and an exterior of the instrument and through which the stage support rod passes into the vacuum chamber, the stage support rod including at least one sealing member to maintain vacuum in the chamber and at least one indexing member to assist in radially and axially positioning the stage support rod in the vacuum chamber, the apparatus comprising:
   a hollow rod dimensioned to replace the stage support rod, the hollow rod having a distal end and a sealing member and an indexing member substantially identical to those on the stage support rod to pass through said exchange chamber in place of the stage support rod while maintaining vacuum within the evacuated vacuum chamber;
   an electrode disposed at the distal end of the hollow rod, the electrode being an electrically conductive hollow cylinder, and having a diameter equal to or less than that of the hollow rod;
   a source of cleaning gas in selective fluid communication with the hollow rod;
   a sensor coupled to the hollow rod to measure pressure inside the rod;
   a control valve coupled to the hollow rod exterior of the vacuum chamber to control flow of cleaning gas into the hollow rod; and
   an electrical power source in electrical communication with the electrode, wherein the hollow rod and electrode are selectively positioned in the specimen imaging area within the cleaning gas delivered through the rod and to the electrode to generate a plasma that emits an excited gas proximal the specimen imaging area for oxidative cleaning the specimen imaging area.

2. The apparatus according to claim 1, wherein the electrical power source supplies radio-frequency power to the electrode.

3. The apparatus according to claim 1, wherein the excited gas includes oxygen radicals and active neutral species.

4. The apparatus according to claim 3, wherein the cleaning gas is a mixture of oxygen and nitrogen, including air, and the active neutral species include oxygen radicals.

5. The apparatus according to claim 1, further comprising a coaxial cable connecting the electrode with the electrical power source.

6. The apparatus according to claim 1, wherein the cleaning gas is supplied to the interior of the hollow rod in a quantity and at a rate sufficient to push the excited gas out of the specimen imaging area in the instrument by a pressure differential for oxidative cleaning of other locations within the instrument.

7. A charged-particle-beam instrument comprising:
a vacuum chamber that is maintained under vacuum during analysis of a specimen;
an exchange chamber in fluid communication between the vacuum chamber and an exterior of the instrument;
a stage support rod, the stage support rod passing through the exchange chamber to introduce and manipulate specimens within the vacuum chamber of the instrument;
a sealing member carried by the stage support rod and cooperating with the exchange chamber to maintain vacuum in the vacuum chamber during introduction and manipulation of specimens;
an indexing member on the stage support rod to assist in radially and axially positioning the stage support rod and specimen within the vacuum chamber;
a hollow rod dimensioned to replace the stage support rod, the hollow rod having a distal end, the hollow rod having a sealing member and an indexing member substantially identical to those of the stage support rod, wherein the hollow rod is passed through the exchange chamber in place of the stage support rod and maintains vacuum within the evacuated vacuum chamber;
an electrode disposed at the distal end of the hollow rod, the electrode being hollow, electrically conductive, and having an external dimension equal to or less than that of the hollow rod;
a source of cleaning gas in selective fluid communication with the hollow rod;
a sensor coupled to the hollow rod to measure pressure inside the rod;
a control valve coupled to the hollow rod exterior of the vacuum chamber to control flow of cleaning gas into the hollow rod; and
an electrical power source in electrical communication with the electrode, wherein the hollow rod and electrode are selectively positioned in a selected location within the instrument and cleaning gas delivered through the rod and to the electrode to generate a plasma that emits an excited cleaning gas proximal the selected location for oxidative cleaning of the selected location.

8. The apparatus according to claim 7, wherein the electrical power source supplies radio-frequency power to the electrode.

9. The apparatus according to claim 7, wherein the excited gas includes oxygen radicals and active neutral species.

10. The apparatus according to claim 7, further comprising a coaxial cable connecting the electrode with the electrical power source.

11. The apparatus according to claim 7, wherein the cleaning gas is supplied to the interior of the hollow rod in a quantity and at a rate sufficient to push, by pressure differential, the excited gas out of the specimen imaging area in the instrument for oxidative cleaning of other locations within the instrument.

12. The apparatus according to claim 11, wherein the cleaning gas is a mixture of oxygen and nitrogen, including air, and the active neutral species include oxygen radicals.

* * * * *